United States Patent [19]

Ackerman et al.

[11] Patent Number: 5,052,015
[45] Date of Patent: Sep. 24, 1991

[54] PHASE SHIFTED DISTRIBUTED FEEDBACK LASER

[75] Inventors: David A. Ackerman, Hopewell; Philip J. Anthony, Bridgewater; Leonard J.-P. Ketelsen, Fanwood, all of N.J.; Venkataraman Swaminathan, Macungie, Pa.

[73] Assignee: AT&T Bell Laboratories, Murray Hill, N.J.

[21] Appl. No.: 581,870

[22] Filed: Sep. 13, 1990

[51] Int. Cl.$^5$ .................................................. H01S 3/19
[52] U.S. Cl. ........................................ 372/96; 372/45
[58] Field of Search ............................. 372/96, 46, 45

[56] References Cited

U.S. PATENT DOCUMENTS

| | | | |
|---|---|---|---|
| 3,760,292 | 9/1973 | Kogelnik et al. | 372/96 |
| 4,740,987 | 4/1988 | McCall et al. | 372/96 |
| 4,775,980 | 10/1988 | Chinone et al. | 372/96 |
| 4,796,273 | 1/1989 | Yamaguchi | 372/96 |
| 4,833,687 | 5/1989 | Hirata | 372/96 |
| 4,847,857 | 7/1989 | Ohkura | 372/96 |

OTHER PUBLICATIONS

*IEEE Photonic Technology Letters*, 1, "Corrugation-Pitch-Modulated Phase-Shifted DFB Laser,"]by M. Okai, et al., August 1989, pp. 200–201.

*Applied Physics Letters*, 55, Jul. 31, 1989, "Novel Method to Fabricate Corrugation for a λ/4-Shifted Distributed Feedback Laser Using A Grating Photomask", by M. Okai et al., pp. 414–417.

*Primary Examiner*—James W. Davie
*Attorney, Agent, or Firm*—R. D. Laumann

[57] ABSTRACT

A semiconductor distributed feedback laser having a grating with λ/4 phase shift which is produced by moving the left and right sections of the grating with respect to each other in a direction perpendicular to the longitudinal axis of the active region.

8 Claims, 2 Drawing Sheets

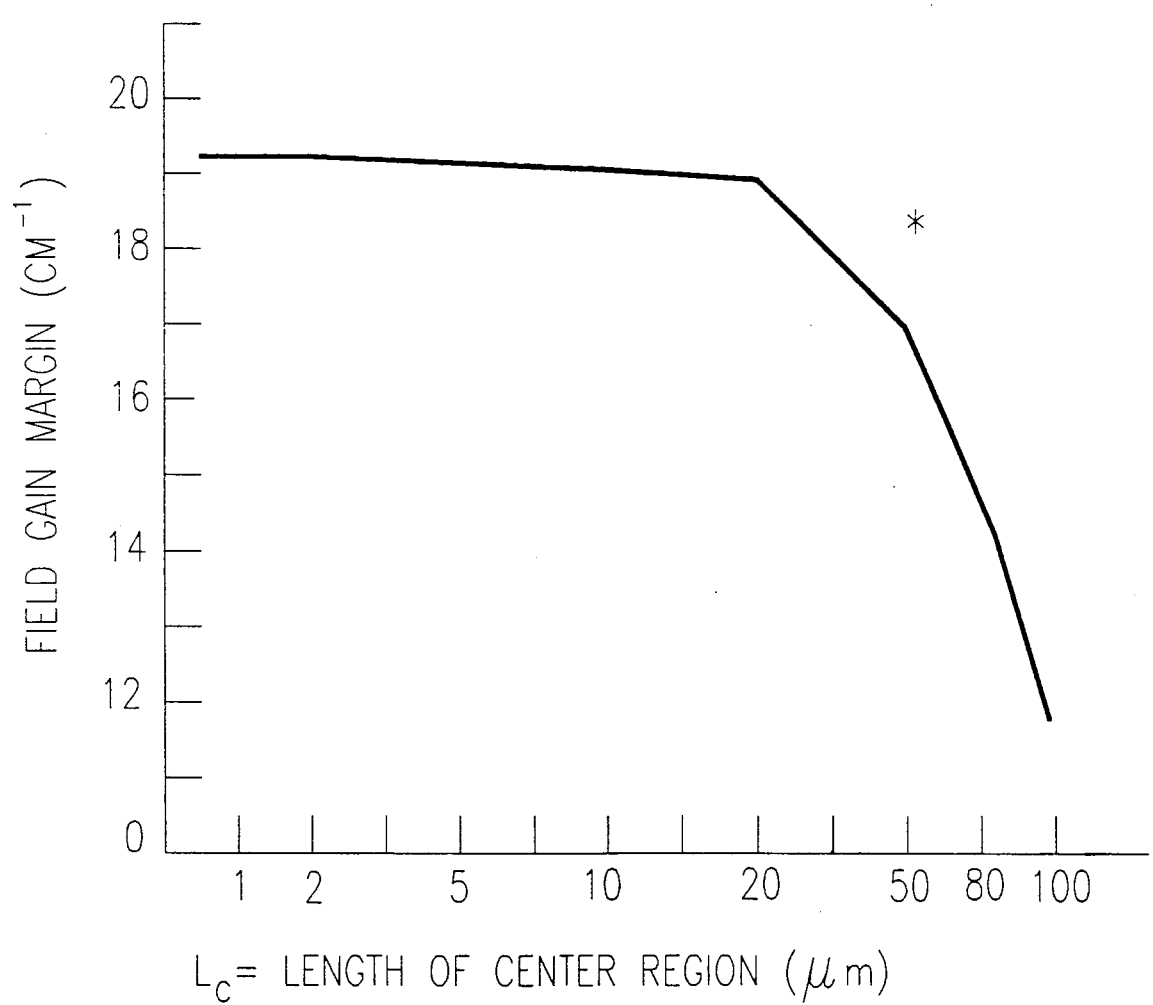

PHASE SHIFTED DISTRIBUTED FEEDBACK LASER

TECHNICAL FIELD

This invention relates to single frequency semiconductor lasers.

BACKGROUND OF THE INVENTION

Optical communications sytems, as presently contemplated, use a light source and a photodetector that are optically coupled to each other through a glass transmission line which is commonly termed an optical fiber. The light source is typically either a double heterostructure semiconductor laser or light emitting diode which have become the light sources of choice for optical communications systems. Such light source have a narrow bandgap region surrounded, on opposed major surfaces, by two wide bandgap layers. The narrow bandgap region, termed the active region, has a refractive index greater than that of the wide bandgap layers, which are termed the cladding layers. Electrons and holes combine in the narrow bandgap region and thereby generate radiation. The narrow bandgap region forms the optical cavity in which most of the light is confined. Light is used to mean electromagnetic energy in the ultraviolet, visible and infrared regions of the frequency spectrum. Due to the distribution of the density of states as a function of energy, the emission lines of semiconductor lasers are relatively broad, as compared to the emission lines of, e.g. He-Ne lasers.

A typical optical fiber has dispersive characteristics; i.e., light at different wavelengths or in different modes propagates through the fiber at different velocities. Dispersive characteristics create a problem in optical communications systems because a combination of linewidth, transmission distance, and data transmission rate can result in adjacent optical pulses overlapping, when detected, due to dispersion. Of course, information is lost when pulses overlap. The problem associated with modal dispersion can be eliminated by using single-mode optical fibers, but wavelength dispersion frequently causes a problem due to the broad emission lines of semiconductor lasers. Some solutions are easily devised. For example, if the data transmission rate is decreased, the time between pulses is increased and the pulse overlap can be eliminated. This is undesirable because the data transmission rate is decreased. Other solutions, such as decreasing the transmission distance, are similarly undesirable. For this reason, as well as for other reasons, narrow linewidth lasers have been sought.

One approach users lasers with feedback means formed by, e.g. a grating. The first laser using integral feedback means is described in U.S. Pat. No. 3,760,292 issued on Sept. 18, 1973 to Kogelnik and Shank. Periodic spatial variations of, e.g. the refractive index, were used to create a single frequency output. Later developments explicitly extended the work of Kogelnik and Shank to semiconductor lasers. Such semiconductor lasers used a grating, which is optically coupled to and in or near the active layer, to obtain single frequency operation. These lasers are now termed, e.g. distributed feedback lasers. This term is, of course, applicable to lasers other than semiconductor lasers. Distributed feedback lasers are usually referred to by the acronym DFB and, in their semiconductor embodiments, have linewidths sufficiently narrow so that they are perfectly adequate for many optical communications purposes. However, as initially fabricated, they have a degeneracy which can result in emission in either one of two closely spaced emission lines. For many purposes, however, only a single emission line is desired, and this degeneracy should be removed.

Accordingly, those skilled in the art have attempted to fabricate distributed feedback lasers lasers without this degeneracy. One approach modifies the grating by introducing a quarter-wave phase shift, also termed a phase slip, which may be either abrupt or gradual. In an ideal laser, the phase slip occurs in as small portion of the total cavity as possible, thereby increasing the grating length in the two phase shifted parts of the cavity. In an abrupt phase shift laser, the gain margin, all other considerations being equal, is greater than it is for a gradual phase shift laser.

An example of an abrupt phase shift is described in U.S. Pat. No. 4,740,987 issued on Apr. 26, 1988 to McCall and Platzman. The phase slip discontinuity was located off-center, i.e., it was not located at the center of the longitudinal axis of the grating as it was in the prior art. The location of the localized phase slip was chosen by McCall and Platzman to maximize the difference between threshold gain of the lowest mode and cavity loss of the next lowest mode.

Another example of a phase shift is described in *IEEE Photonics Technology Letters*, 1, pp. 200-201, August 1989. The phase shift was introduced by what the authors termed a corrugation pitch modulation; i.e., the pitch of the grating was changed in one section to obtain the desired phase shift. Another approach alters the refractive index in a portion of the lasing cavity to produce the desired phase shift by, e.g., changing the transverse dimension of the active layer. This approach uses a uniform grating.

As might be expected, different techniques have been proposed for fabricating the grating. Typical techniques use laser beam holography. Another approach is described in *Applied Physics Letters*, 55, pp. 414–417, Jul. 31, 1989. This approach transfers a mechanically ruled grating to the semiconductor using photolithographic techniques.

However, these approaches all suffer from one or more drawbacks. An abrupt phase shift, the most technologically sophisticated approach, is difficult to implement in practice, especially if crystal growth over the grating is required. The holographic approach generates a non-uniform grating whereas, for many purposes, it would be desirable to produce a uniform grating. Variations in the refractive index produced by, e.g., changing the transverse dimension of the lasing cavity may be difficult to implement. More fundamentally, such an approach may introduce higher order modes and reflections which are undesirable. A gradual phase shift may lose significant distributed feedback action in the phase shift section, and also the gain margin is expected to be less than it is for lasers with an abrupt phase shift.

SUMMARY OF THE INVENTION

A semiconductor laser has an active region having a longitudinal axis, first and second cladding layers on opposed major surfaces of the active region, distributed feedback means comprising a grating optically coupled to the active region, the grating having left and right sections and at least one bending section between the left and right sections with the left and right sections being displaced from each other in a direction perpendicular to the longitudinal axis of the active region, thereby producing a phase slip. In one preferred embodiment, the phase slip is approximately λ/4. In another preferred embodiment, the bending section is curved with radii of curvature selected to minimize radiation losses from the curved portions of the bending section. In yet another preferred embodiment, the layers comprise compound semiconductors selected from the group consisting of Group III-V and Group II-VI compound semiconductors.

BRIEF DESCRIPTION OF THE DRAWING

FIG. 3 illustrates the relationship between bending section length and gain margin; and, FIG. 4 is a top view of a portion of a grating which is useful in explaining the design considerations for the bending section.

For reasons of clarity, the elements of the lasers depicted are not drawn to scale.

DETAILED DESCRIPTION

Figure 1:
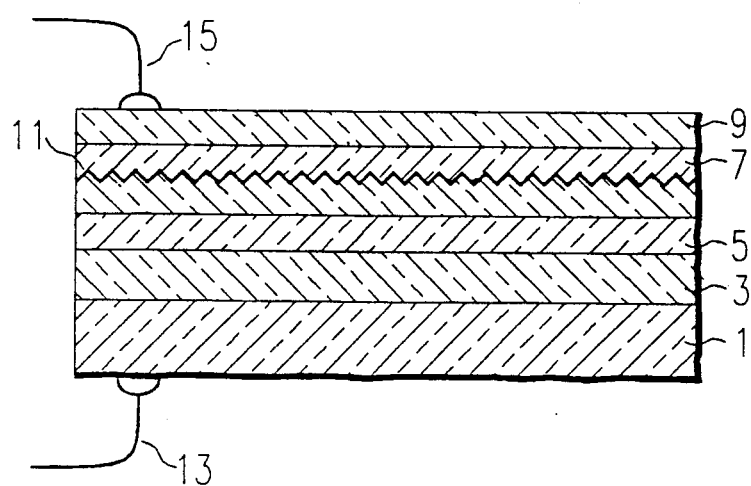
FIG. 1 is a sectional side view of a laser according to this invention.

FIG. 1 is a sectional view of a laser according to this invention. The laser may be termed a bent cavity laser. The laser comprises substrate 1, first cladding layer 3, active region 5, second cladding layer 7, and contact layer 9. Distributed feedback means is provided by grating 11 which is in the second cladding layer near the interface of the active region and the second cladding layer. Grating 11 is optically coupled to the active region. The active region is where carriers recombine and also acts as a waveguide region because of the refractive index differences between this region and the cladding layers. Substrate 1 and contact layer 9 are electrically contacted by ohmic contacts 13 and 15, respectively. The substrate and first contact layer have a first conductivity type, and the second cladding layer and contact layer have a second conductivity type.

The laser depicted is a double heterostructure laser, and the bandgap of the active region is less than the bandgaps of the cladding layers. Any of the well known laser designs may be used. Anti-reflection coatings may be used if desired. The refractive index of the active region is greater than the refractive indices of the cladding layers. This structure provides both carrier and optical energy confinement within the active region, although it will be readily appreciated that such confinement is not total. The precise location of the grating is not critical, provided that is optically coupled to the active region and provides the necessary feedback means. Additional layers, not depicted, may be present.

Those skilled in the art will understand how to fabricate the laser depicted. Appropriate dimensions and materials for the elements will be readily selected by those skilled in the art. The materials will typically be compound semiconductors selected from the group consisting of Group III-V and Group II-VI compound semiconductors. The semiconductor composition selected will depend upon the desired emission wavelength; i.e., the bandgap of the semiconductor. Fabrication techniques, including epitaxial growth methods, will be readily selected by those skilled in the art and, accordingly, they need not be described in detail. The layers will typically be grown lattice matched or approximately lattice matched to each other and to the substrate, although the use of strained layers is also contemplated. Strained layers are not lattice matched to each other, and the lattice mismatch is accommodated by strain which distorts the unit cell. Additionally, although only a single layer in the active region is depicted, the use of a plurality of layers in the active region is also contemplated. For example, a multiquantum well laser may be fabricated. Grating design and fabrication will be discussed in detail later.

Figure 2:
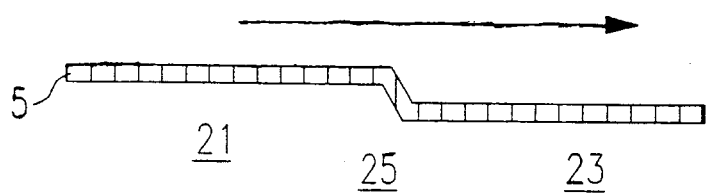
FIG. 2 is a top view of the grating of a laser according to this invention.

FIG. 2 is a top view of the grating comprising left and right sections 21 and 23, respectively, which are coupled to each other by bending section 25; i.e., the bending section is between the left and right sections. The pitch of the grating is essentially constant. The longitudinal axis of active region 5 is indicated by the arrow. As can be seen, the left and right sections are displaced with respect to each other in a direction perpendicular to the longitudinal axis of the active region and in the plane of the layers. The displacement of the two sections with respect to each other produces a phase slip which is approximately λ/4 in one preferred embodiment.

As will be appreciated, the amount of phase shift depends upon the shape of the bending section and the displacement of the left and right sections with respect to each other. The actual shape used can be determined from consideration of the following. The optical energy loss at the bends should be as low as possible, and the actual radii of curvature should thus be less than the critical radius and should minimize radiation losses. However, the bending section is not absolutely in phase with either the left or right sections and therefore does not contribute as strongly toward control of the mode. It is thus desirable that the length of the bending section should be a small, e.g. desirably less than 20 percent, fraction of the longitudinal axis of the active region. Processing considerations for the laser dictate that the deviation from a straight stripe be kept as small as possible. These processing considerations lead to a longer bending section. The optimum design will represent a comprise between the two considerations discussed.

The precise location of the phase slip section along the grating length is not critical. However, the considerations emphasized by McCall and Platzman are generally applicable here.

The photons in the laser cavity see a grating which is chirped, i.e., wavelength shifted, in the bending section. However, in cases of modest bending in which the wavelength shift is small, the interaction at the distributed feedback lasing wavelength with the bending, i.e., chirped section, contributes distributed feedback action to the overall feedback within the DFB laser. Consequently, the gain margin is higher than it would be in lasers with comparable length non-grating sections. This is better evident from consideration of FIG. 3, which illustrates the relationship between a hypothetical nongrating section length and gain margin for a quarter wave shifted laser. The length of the center, nongrating section, $L_c$, is plotted horizontally in units of microns, and the gain margin is plotted vertically in units of $cm^{-1}$. The phase shift section was in the center of the cavity which had a total length of 381 μm, antireflection coatings on both facets, and a $\kappa = 66.7$ $cm^{-1}$. The phase shift was 90°. A significant loss of gain margin occurs for phase shift sections more than 20 μm long. The asterisk indicates the bent cavity laser which, by means of a grating in the bent section, restores the gain margin.

Figure 4:
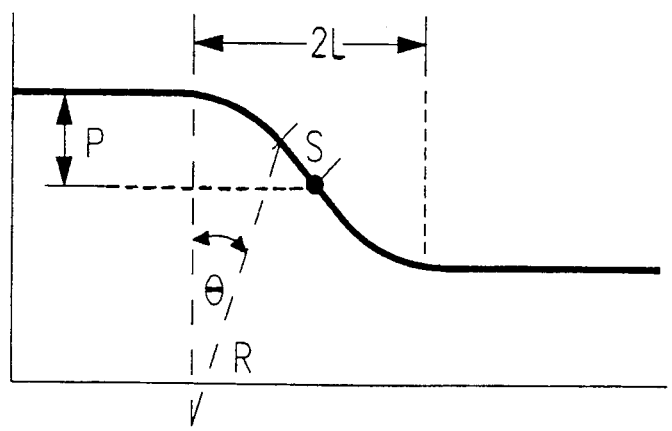

FIG. 4 is a top, schematic view of a portion of the grating, which includes the bending section, and is useful in explaining the design considerations in more detail. As shown, the bending section comprises two curved sections. The following symbols are used: R is the radius of curvature; $\theta$ is the angle (in radians) of the circle included; L is the half length of the bending section; S is the length of an optional straight section inserted between the curved sections of the S bend; P is half of the perpendicular separation of the two straight sections; and $\Delta$ is a wavelength shift, usually referred to as $\lambda/4$. The optical path length change of the bending section, as compared to a straight section of length L, should be $\Delta$. One skilled in the art can now show that $R = \frac{1}{2}\Delta - L(1/\cos\theta - 1)/(\theta - \tan\theta)$ and $S = (L - R\sin\theta)/\cos\theta$. The perpendicular separation of the two sections is given by $P = R(1 - \cos\theta) + S\sin\theta$. The three equations with six parameters, $\Delta$, L, S, $\theta$, R, and P, may be solved after setting values for several parameters based on considerations, such as those described above.

The grating is easily fabricated using standard lithographic patterning techniques to define the grating pattern. The grating can then be etched into a semiconductor layer and then followed by regrowth of another material. The refractive index variations needed for the grating thus come from compositional variations. Other fabrication techniques will be well known to those skilled in the art.

Variations in the embodiment described will be readily thought of by those skilled in the art. For example, although the bending section is depicted as being at the approximate midpoint of the longitudinal axis of the active layer, it may be displaced a significant distance from the midpoint. Additionally, the laser may have the active layer split into two sections with each section separately contacted, thus resulting in a three-terminal device. Furthermore, the laser may have two bending sections. Moreover, the fabrication of multiquantum-well lasers is also contemplated.

We claim:

1. In a semiconductor laser, an arrangement comprising:
   an active region having a longitudinal axis;
   first and second cladding layers on opposed major surfaces of said active region;
   distributed feedback means comprising a grating optically coupled to said active region, said grating having left and right sections and at least one bending section between said right and said left sections, said left and right sections being displaced from each other in a direction perpendicular to said longitudinal axis of said active region thereby producing a phase slip.

2. A semiconductor laser as recited in claim 1 in which said phase slip is approximately $\lambda/4$.

3. A semiconductor laser as recited in claim 2 in which said bending section is at the approximate midpoint of said longitudinal axis of said active layer.

4. A semiconductor laser as recited in claim 3 in which said bending section comprises two curved sections.

5. A semiconductor laser as recited in claim 4 in which said curved sections have radii of curvature selected to minimize loss from radiation.

6. A semiconductor laser as recited in claim 5 in which said bending section further comprises a straight section between said curved sections.

7. A semiconductor laser as recited in claim 2 comprising at least two bending sections.

8. A semiconductor laser as recited in claim 1 in which said bending section has a length less than 20 percent of the longitudinal axis of said active region.

* * * * *